(12) United States Patent
Ohmi et al.

(10) Patent No.: US 7,800,202 B2
(45) Date of Patent: *Sep. 21, 2010

(54) SEMICONDUCTOR DEVICE

(75) Inventors: Tadahiro Ohmi, Miyagi (JP); Akinobu Teramoto, Miyagi (JP)

(73) Assignees: Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 179 days.

This patent is subject to a terminal disclaimer.

(21) Appl. No.: 12/085,776

(22) PCT Filed: Nov. 30, 2006

(86) PCT No.: PCT/JP2006/323997

§ 371 (c)(1),
(2), (4) Date: May 30, 2008

(87) PCT Pub. No.: WO2007/063963

PCT Pub. Date: Jun. 7, 2007

(65) Prior Publication Data

US 2009/0166739 A1    Jul. 2, 2009

(30) Foreign Application Priority Data

Dec. 2, 2005 (JP) .............................. 2005-349972

(51) Int. Cl.
H01L 29/04 (2006.01)
(52) U.S. Cl. .................. 257/628; 257/351; 257/352; 257/627; 257/E29.003; 257/E29.004; 257/E27.112
(58) Field of Classification Search ................ 257/351, 257/352, 627, 628, E29.003, E29.004, E27.112
See application file for complete search history.

(56) References Cited

U.S. PATENT DOCUMENTS

| | | | | |
|---|---|---|---|---|
| 4,768,076 | A | * | 8/1988 | Aoki et al. ............... 257/70 |
| 6,037,610 | A | * | 3/2000 | Zhang et al. .............. 257/64 |
| 6,903,393 | B2 | | 6/2005 | Ohmi et al. |
| 6,911,383 | B2 | | 6/2005 | Doris et al. |
| 7,202,534 | B2 | | 4/2007 | Ohmi et al. |
| 7,250,658 | B2 | | 7/2007 | Doris et al. |
| 2006/0084244 | A1 | * | 4/2006 | Yeo et al. ................. 438/478 |
| 2007/0096175 | A1 | | 5/2007 | Ohmi et al. |

FOREIGN PATENT DOCUMENTS

| | | |
|---|---|---|
| JP | 52-045880 | 4/1977 |
| JP | 7-86422 | 3/1995 |
| JP | 9-23011 | 1/1997 |
| JP | 2003-115587 | 4/2003 |
| JP | 2003-188273 | 7/2003 |
| JP | 2005-19996 | 1/2005 |

* cited by examiner

Primary Examiner—Long K Tran
(74) Attorney, Agent, or Firm—Foley & Lardner LLP

(57) ABSTRACT

In order to obtain substantially the same operating speed of a p-type MOS transistor and an n-type MOS transistor forming a CMOS circuit, the n-type MOS transistor has a three-dimensional structure having a channel region on both the (100) plane and the (110) plane and the p-type MOS transistor has a planar structure having a channel region only on the (110) plane. Further, both the transistors are substantially equal to each other in the areas of the channel regions and gate insulating films. Accordingly, it is possible to make the areas of the gate insulating films and so on equal to each other and also to make the gate capacitances equal to each other.

22 Claims, 11 Drawing Sheets

MOSFET Device Operating Principle (a) $V_g = 0V$ (b) $0 < V_g < V_{fb}$ (c) $V_g = V_{fb}$ (d) $V_g > V_{fb}$ (a)

(b)

(a)

(b)

SEMICONDUCTOR DEVICE

CROSS-REFERENCE TO RELATED PATENT APPLICATIONS

This application is a National Stage Application of PCT/JP2006/323997, filed Nov. 30, 2006, which is a continuation of Japan Priority Application 2005-349972, filed Dec. 2, 2005, including the specification, drawings, claims and abstract, is incorporated herein by reference in its entirety.

TECHNICAL FIELD

This invention relates to a semiconductor device such as an IC or LSI.

BACKGROUND ART

FIG. 10 shows a conventional semiconductor device structure which is exemplified by a CMOS inverter circuit which acts as one of electronic circuits for use in a semiconductor device. FIG. 10(a) diagrammatically shows a section of the CMOS inverter circuit and FIG. 10(b) shows a plan view thereof. For simplification, illustration of lines 8 to 11 is omitted from FIG. 10(b).

In FIG. 10(a), 1 denotes a p-type semiconductor substrate where an electronic circuit is formed; 2 denotes an n-type impurity region formed in the p-type semiconductor substrate 1; 3a and 3b denote high-concentration p-type impurity regions formed in the n-type impurity region 2; 4a and 4b denote high-concentration n-type impurity regions formed in the p-type semiconductor substrate 1; 5 denotes gate insulating films of $SiO_2$ or the like for insulation between a gate electrode 6 and the p-type semiconductor substrate 1 and between a gate electrode 7 and the n-type impurity region 2, respectively; and 6 and 7 denote the gate electrodes formed on the gate insulating films 5, respectively.

Herein, the n-type impurity region 2, the high-concentration p-type impurity regions 3a and 3b, and the gate electrode 7 form a p-channel MOSFET (Metal Oxide Semiconductor Field Effect Transistor). On the other hand, the semiconductor substrate 1, the high-concentration n-type impurity regions 4a and 4b, and the gate electrode 6 form an n-channel MOSFET. A gate line 8 is connected to the gate electrodes 6 and 7 of the n-channel MOSFET and the p-channel MOSFET and serves to apply a common voltage as an input signal of the CMOS inverter circuit while an output line 9 is connected to the drain electrode (high-concentration p-type impurity region 3a) of the p-channel MOSFET and the drain electrode (high-concentration n-type impurity region 4b) of the n-channel MOSFET to produce an output signal of the CMOS inverter. Power supply lines 10 and 10 are connected to the source electrode (high-concentration n-type impurity region 4a) of the n-channel MOSFET and the source electrode (high-concentration p-type impurity region 3b) of the p-channel MOSFET, respectively, to provide electric voltages.

The operation of this CMOS inverter circuit will be described. In the illustrated CMOS inverter circuit comprising the p-channel MOSFET and the n-channel MOSFET of FIG. 10(a), the power supply line 10 which is connected to the source electrode of the n-channel transistor is grounded (0V) and the power supply voltage (e.g. 5V) is applied to the power supply line 11 connected to the source electrode of the p-channel transistor.

When an input signal of 0V is applied to the gate line 8, the n-channel transistor is turned off while the p-channel transistor is turned on. Therefore, the power supply voltage (5V) is given to the power supply line 11 and is output to the output line 9. On the other hand, when the input signal of 5V is applied to the gate line 8, conversely to the above case, the n-channel transistor is turned on while the p-channel transistor is turned off. As a result, the ground voltage (0V) which is given to the power supply line 10 is output to the output line.

In this CMOS type circuit, the current hardly flows in the transistors when the output does not change and it mainly flows when the output changes. That is, when the gate line 8 becomes 0V, an output current for charging the output line 9 flows through the p-channel transistor, while, when the gate line 8 becomes 5V, an output current for discharging the charge of the output line 9 flows through the n-channel transistor. In this manner, the CMOS circuit of FIG. 10(a) is formed as an inverter circuit adapted to output a signal with a polarity reverse to that of the input. In this inverter circuit, it is necessary to cause the same current to flow in the p-channel transistor and the n-channel transistor for equalizing the rising speed and the falling speed upon switching.

However, for example, on the (100) plane, the mobility of holes serving as carriers in the p-channel transistor is lower than that of electrons serving as carriers in the n-channel transistor and the ratio is 1:3. Therefore, if the p-channel transistor and the n-channel transistor have the same area, there occurs a difference in current driving capability therebetween and thus the operating speeds cannot be the same. Accordingly, as shown in FIG. 10(b), the areas of the drain electrode 3a, the source electrode 3b, and the gate electrode 7 of the p-channel transistor are set larger than those of the drain electrode 4b, the source electrode 4a, and the gate electrode 6 of the n-channel transistor corresponding to their mobility ratio to substantially equalize the current driving capabilities, thereby making the switching speeds equal to each other. However, this needs to widen the area occupied by the p-channel transistor by three times that of the n-channel transistor and thus the areas occupied by the p-channel transistor and the n-channel transistor become unbalanced, which has been a barrier to improve integration degree of semiconductor devices.

As a prior document relating to improvement in current driving capability of a p-channel transistor, there is Patent Document 1 mentioned below. In Patent Document 1, the current driving capability of a p-channel transistor is improved by using the (110) plane. Further, Patent Document 2 describes that the current driving capability of a p-channel transistor is improved by using an SOI substrate and forming an accumulation-mode p-channel transistor on the SOI substrate. However, when an arbitrary substrate is used, it is impossible to actually equalize the current driving capabilities of an n-channel transistor and a p-channel transistor having the same size in an ON-state. Further, in the accumulation-mode transistor disclosed in Patent Document 2, a substrate electrode is essential in addition to a gate electrode and a voltage adapted to form a depletion layer in a channel region to pinch off a channel should be applied to both electrodes, and therefore, there has been a drawback in that it is complicated in terms of structure and circuit.

Patent Document 1: Japanese Unexamined Patent Application Publication (JP-A) No. 2003-115587

Patent Document 2: Japanese Unexamined Patent Application Publication (JP-A) No. Hei 07-086422

DISCLOSURE OF THE INVENTION

Problem to be Solved by the Invention

As described above, in the CMOS circuit using the (100) crystal plane, the current driving capabilities of the n-channel transistor and the p-channel transistor having the same size differ from each other and thus there is a difference in switching speed. In order to make the switching speeds (rising and falling) equal to each other, it is necessary to increase a channel width of the p-channel transistor. Therefore, the areas occupied by the n-channel transistor and the p-channel transistor become unbalanced, which has been a barrier to improvement in integration degree of semiconductor devices.

In the prior-application Patent Document 1, the current driving capability of the p-channel transistor is improved, but it is insufficient to make the sizes of the n-channel transistor and the p-channel transistor equal to each other.

It is an object of this invention to obtain a semiconductor device that enables an increase in integration degree by making the switching speeds of a pair of transistors of different conductivity types, forming a CMOS circuit, substantially equal or equivalent to each other and making the areas of electrodes thereof substantially equal or equivalent to each other.

It is another object of this invention to provide an accumulation-mode transistor with no complexity in terms of structure and circuit.

Means for Solving the Problem

A semiconductor device according to claim 1 or 2 comprises a circuit having at least a pair of transistors of different conductivity types, wherein an n-channel transistor is formed using a first semiconductor layer provided on an SOI substrate and a first gate insulating layer covering at least part of a surface of the first semiconductor layer, a p-channel transistor being formed using a second semiconductor layer provided on the SOI substrate and a second gate insulating layer covering at least part of a surface of the second semiconductor layer; a surface of a first region for forming a channel of the first semiconductor layer has a (110) plane or a plane within ±10° from the (110) plane, a surface of a second region for forming a channel on a side of the first semiconductor layer has one or a plurality of planes different from the plane within ±10° from the (110) plane and adapted to provide a greater mobility of electrons than the plane within ±10° from the (110) plane, and a surface of a third region for forming a channel of the second semiconductor layer has a (110) plane or a plane within ±10° from the (110) plane; and wherein a width and a length of the surface of the first region, a height and a length of the surface of the second region, and a width and a length of the surface of the third region are determined so that the sum of an area of the surface of the first region and an area of the surface of the second region is substantially equal or equivalent to an area of the surface of the third region and, further, operating speeds of the n-channel transistor and the p-channel transistor are substantially equal or equivalent to each other. Herein, it is preferable to adjust the area by changing the width or the height while maintaining the gate length L constant. The n-channel transistor and the p-channel transistor are each normally off and the n-channel transistor is either in an inversion mode or in an accumulation mode, while the p-channel transistor is either in the inversion mode or in the accumulation mode.

In a semiconductor device according to claim 3, the n-channel transistor and the p-channel transistor are each in the inversion mode.

In a semiconductor device according to claim 4, the n-channel transistor and the p-channel transistor are each in the accumulation mode.

In a semiconductor device according to claim 5, the n-channel transistor is in the inversion mode and the p-channel transistor is in the accumulation mode.

In a semiconductor device according to claim 6, the n-channel transistor is in the accumulation mode and the p-channel transistor is in the inversion mode.

In a semiconductor device according to claim 7, a material of a second gate electrode provided on the second gate insulating film and an impurity concentration in the second semiconductor layer are selected so that a thickness of a depletion layer formed in the second semiconductor layer by a work function difference between the second gate electrode and the second semiconductor layer becomes greater than the thickness of the second semiconductor layer.

In a semiconductor device according to claim 8, a material of a first gate electrode provided on the first gate insulating film and an impurity concentration in the first semiconductor layer are selected so that a thickness of a depletion layer formed in the first semiconductor layer by a work function difference between the first gate electrode and the first semiconductor layer becomes greater than the thickness of the first semiconductor layer.

In a semiconductor device according to claim 9, the first and second gate insulating films each contain at least one kind of $SiO_2$, $Si_3N_4$, an oxide of a metal silicon alloy, and a nitride of metal silicon alloy formed by a microwave-excited plasma.

In a semiconductor device according to claim 10, the gate insulating films are formed at a temperature of 600° C. or less using a microwave-excited plasma.

In a semiconductor device according to claim 11, the length of the surface of the first region, the length of the surface of the second region, and the length of the surface of the third region each forming a channel length are determined so as to be substantially equal to each other. Accordingly, it is only required to determine the widths of channel regions and thus the manufacture is simplified and the productivity is improved.

A semiconductor device according to claim 12 comprises a circuit having at least a pair of transistors of different conductivity types, wherein a transistor of one conductivity type is formed using a first semiconductor layer provided on an SOI substrate and a first gate insulating layer covering at least part of a surface of the first semiconductor layer; a transistor of another conductivity type is formed using a second semiconductor layer provided on the SOI substrate and a second gate insulating layer covering at least part of a surface of the second semiconductor layer; wherein a surface of a first region for forming a channel of the first semiconductor layer has a first crystal plane, a surface of a second region forming a channel region and provided on a plane crossing the surface of the first region on a side of the first semiconductor layer has a second crystal plane different from the first crystal plane and adapted to provide a different mobility of carriers than the first crystal plane, and a surface of a third region for forming a channel of the second semiconductor layer has the first crystal plane; and wherein, given that a mutual conductance gm on the surface of the first region is gm1, a mutual conductance gm on the surface of the second region is gm2 that is greater than gm1 (i.e. gm2>gm1), a mutual conductance gm on the surface of the third region is gm3 that is greater than gm1 but smaller than gm2 (i.e. gm1<gm3<gm2), a length and a width of the surface of the first region are L1 and W1, respectively, a length and a width of the surface of the second region are L1 and W2, respectively, a length and a width of the surface of the third region are L2 and W3, respectively, and any three of W1, W2, W3, L1, and L2 are set to predetermined values, the transistor of one conductivity type and the transistor of another conductivity type have areas of channel regions thereof substantially that are equal or equivalent to each other and operating speeds thereof that are substantially equal or equivalent to each other, with the remaining two of W1, W2, W3, L1, and L2 being determined so as to substantially satisfy:

$$W1 \times L1 + W2 \times L1 = W3 \times L2$$

and, further, substantially satisfy: $(gm1 \times W1/L1)+(gm2 \times W2/L1)=gm3 \times W3/L2$. Herein, the second region is formed at a portion where a side surface of the first semiconductor layer is in the form of an inclined plane or a perpendicular plane, and may be formed using only one of both side surfaces or using both side surfaces partly from their top or entirely from their top to bottom.

In a semiconductor device according to claim 13, the L1 and the L2 are set to be equal to each other and any one of W1, W2, and W3 is set to a predetermined value. The remaining two of W1, W2, and W3 are determined so as to substantially satisfy:

$$W1+W2=W3 \times L2$$

and, further, substantially satisfy:

$$gm1 \times W1 + gm2 \times W2 = gm3 \times W3.$$

In a semiconductor device according to claim 14, the second region is formed by portions of both side surfaces of the first semiconductor layer extending on both sides of the surface of the first region and serving as planes substantially perpendicular to the surface of the first region, with a height of each of said portions being given as H, and 2H is substituted for the W2.

In a semiconductor device according to claim 15, the first crystal plane in the transistor of one conductivity type and the transistor of another conductivity type is specified by a (110) plane or a plane within ±10° from the (110) plane.

In a semiconductor device according to claim 16, the transistor of one conductivity type and the transistor of another conductivity type are an n-channel transistor and a p-channel transistor, respectively.

Effect of the Invention

According to this invention, with the foregoing structure, it is possible to obtain a p-channel MOS transistor and an n-channel MOS transistor having the same current driving capability. That is, by forming a p-channel MOS transistor of an electronic circuit into a planar structure while forming an n-channel MOS transistor thereof into a three-dimensional structure, it is possible to equalize the channel areas of both transistors and, therefore, there is an effect of obtaining a semiconductor device having the same switching speed and capable of increasing the integration degree.

DESCRIPTION OF SYMBOLS

Figure 1:
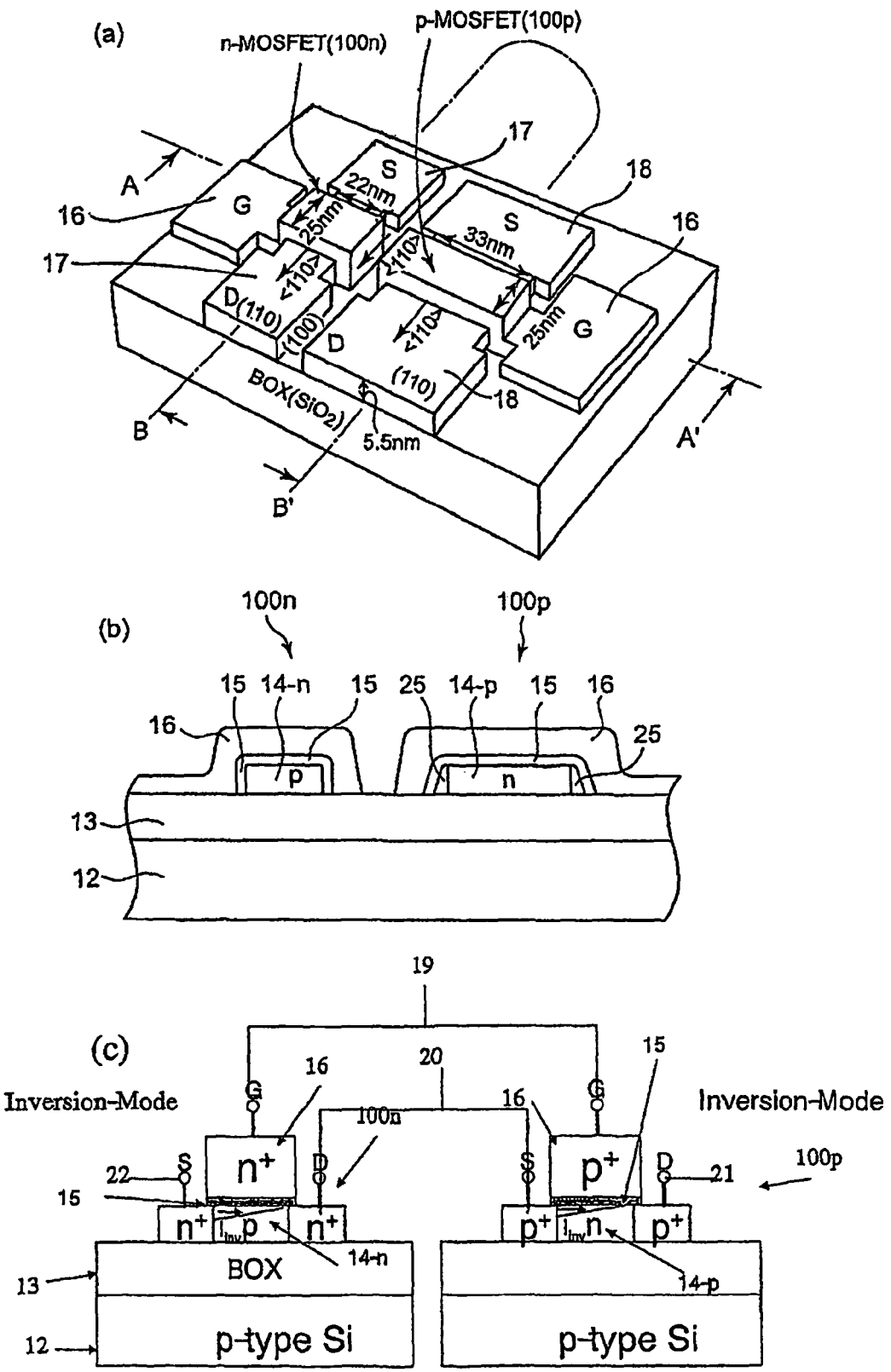
FIG. 1(*a*), (*b*), and (*c*) are diagrams showing a semiconductor device according to a first embodiment of this invention, wherein (a) is a perspective view, and (b) and (c) are sectional views taken along line A-A' and line B-B' in FIG. 1(*a*), respectively.

1 p-type semiconductor substrate
2 n-type impurity region
3*a*, 3*b* high-concentration p-type impurity region
4*a*, 4*b* high-concentration p-type impurity region
5 gate insulating film
6, 7 gate electrode
8 gate line
9 output line
10, 11 power supply line
12 support substrate
13 buried oxide film
14 SOI (Silicon on Insulator) layer
15 gate insulating film
16 gate electrode
17 source/drain layers (NMOS transistor)
18 source/drain layers (PMOS transistor)
19 gate line
20 output line
21, 22 power supply line Best Mode for Carrying Out the Invention Hereinbelow, semiconductor devices of this invention will be described with reference to the drawings.

Exemplary Embodiment 1

Exemplary embodiment 1 will be described using FIG. 1. FIG. 1(*a*) shows a schematic perspective view of a semiconductor device according to the first embodiment of this invention, FIG. 1(b) shows a sectional view taken along line A-A' in FIG. 1(a), and FIG. 1(c) shows a sectional view taken along line B-B' in FIG. 1(a). The embodiment illustrated in FIG. 1 is specified by an SOI-type three-dimensional structure CMOS device in which a p-channel MOS transistor is fabricated only on the (110) plane where the hole mobility is large, while, an n-channel MOS transistor is fabricated on the (110) plane, where the electron mobility is slightly inferior, with its gate formed also on the (100) plane of the side walls where the electron mobility is large. That is, the n-channel transistor has a three-dimensional structure and the p-channel transistor has a planar structure.

As shown in FIGS. 1(b) and (c), there is prepared a substrate having predetermined-thickness, (110) plane orientation silicon layers, i.e. n-type (substrate phosphorus (P) concentration $10^{17}$ cm$^{-3}$) SOI (Silicon on Insulator), layers 14-n and 14-p formed on a support substrate 12 and separated therefrom by a 200 nm-thickness buried oxide film 13. Herein, the surface of each of the SOI layers 14-n and 14-p is preferably such that the channel length direction is a <110> direction. This is because the saturation current amount by the movement of holes on the (110) plane becomes maximum in the <110> direction. On the other hand, it is necessary to consider that the crystal-direction dependence of the saturation current amount by the movement of electrons on the (100) plane is small.

In the illustrated example, the SOI layer is removed by etching at its portions other than the region 14-n where the n-channel transistor will be formed and the region 14-p where the p-channel transistor will be formed. As a result, the regions 14-n and 14-p are separately formed on the oxide film 13. The SOI layer may be formed as an i layer common to both regions or may be formed as a p-type and may thereafter be partially converted into an n-type region from the p-type region 14-p for the p-channel transistor. In this event, threshold adjusting impurity implantation may be performed to carry out substrate concentration adjustment. For example, in the 100 nm generation, it is set to $4 \times 10^{18}$ cm$^{-3}$. The side surfaces of the separated regions are formed by the (100) plane. Among these side surfaces, on the side surfaces excluding the side surfaces of a channel region of the n-channel transistor region 14-n, a thick oxide film 25 is formed by a known method as shown in FIG. 1(b).

For example, the thick oxide film 25 can be formed by the following method. At first, after depositing SiO$_2$ to 45 nm or more by CVD, etching is performed by using anisotropic etching which is small in damage while leaving the oxide film on the side walls. In this event, with portions other than the transistor region 14-n masked, the thick oxide film on the side wall surfaces of the channel region of the n-channel transistor region 14-n is removed by wet etching. On the other hand, the thick oxide film 25 is left on the side walls of the transistor region 14-p.

In FIG. 1(b), after the formation of the oxide film 25, cleaning is performed and, subsequently, gate oxidation is performed using a microwave-excited plasma apparatus. As a result, SiO$_2$ film 15 of 7 nn thick is formed on the upper surface and the side surfaces of the channel region of the n-channel transistor region 14-n and on the upper surface of the channel region of the p-channel transistor region 14-p. In this event, the thickness may be set to a value for obtaining a desired capacitance. As the gate insulating film 15, use may be made of a high permittivity material, such as Si$_3$N$_4$, a metal oxide such as HfO$_x$, ZrO$_x$, or La$_2$O$_3$, or a metal nitride such as Pr$_x$Si$_y$N$_z$.

Thereafter, polycrystalline silicon is formed which contains $10^{20}$cm$^{-3}$ or more in a total concentration of phosphorus or boron or phosphorous and arsenic and is then etched to a desired gate length and width, thereby forming gate electrodes 16. Thereafter, $4 \times 10^{15}$cm$^{-2}$ of arsenic is ion-implanted into source/drain layers 17 of the NMOS transistor region and $4 \times 10^{15}$cm$^{-2}$ of boron is ion-implanted into source/drain layers 18 of the PMOS transistor region, thereby performing activation.

Further, a SiO$_2$ film is formed by CVD and, as shown in FIG. 1(c), a gate line 19, an output line 20, a power supply line 21, and a power supply line 22 are formed as wiring layers, so that an inversion-mode PMOS transistor 100p and an inversion-mode NMOS transistor 100n can be formed on the same substrate. Herein, the total area of the upper surface and the side surfaces of the channel region of the n-channel transistor region 14-n and the area of the upper surface of the channel region of the p-channel transistor region 14-p are rendered equal to each other and, further, the operating speeds of both transistors are rendered equal to each other.

Herein, the lengths L of the channel regions of both transistors 100p and 100n are set equal to each other, the width of the upper surface of the channel region of the n-channel transistor region 14-n is given by Wn, the height of the side surface thereof is given by H, and the width of the upper surface of the channel region of the p-channel transistor region 14-p is given by Wp. Then, a formula (1) should be established.

A formula (2) should be established in order that the operating speeds of both transistors become equal to each other. Herein, it is assumed that mutual conductances on the (100) and (110) planes of the NMOS transistor are given by gmn (100) and gmn(110), respectively, that a mutual conductance on the (110) plane of the PMO transistor is given by gmp (110), and that the mutual conductances gmn(100), gmn (110), and gmp(110) are all known. Further, if, for example, Wn is set to a proper value, required H and Wp are obtained as solutions of simultaneous equations of the formula (1) and the formula (2). If the SOI layer has a plane orientation, such as a (551) plane, that is inclined within ±10° from the (110) plane, the NMOS transistor and the PMOS transistor have substantially the same current driving capability.

Under such conditions, if, for example, Wn is set to 22 nm, gmn(110) is set to about 0.7 gmn(100), and gmp(110) is set to 0.8 gmn(100), H is 5.5 nm and Wp is 33 nm. In the illustrated embodiment, the channel lengths of both transistors are set to 25 nm.

[Numerical Expression 1]

$$W_p = 2H + W_n \quad (1)$$

$$g_{mp}(110) \times W_p = g_{mn}(100) \times 2H + g_{mp}(110) \times W_n \quad (2)$$

Figure 3:
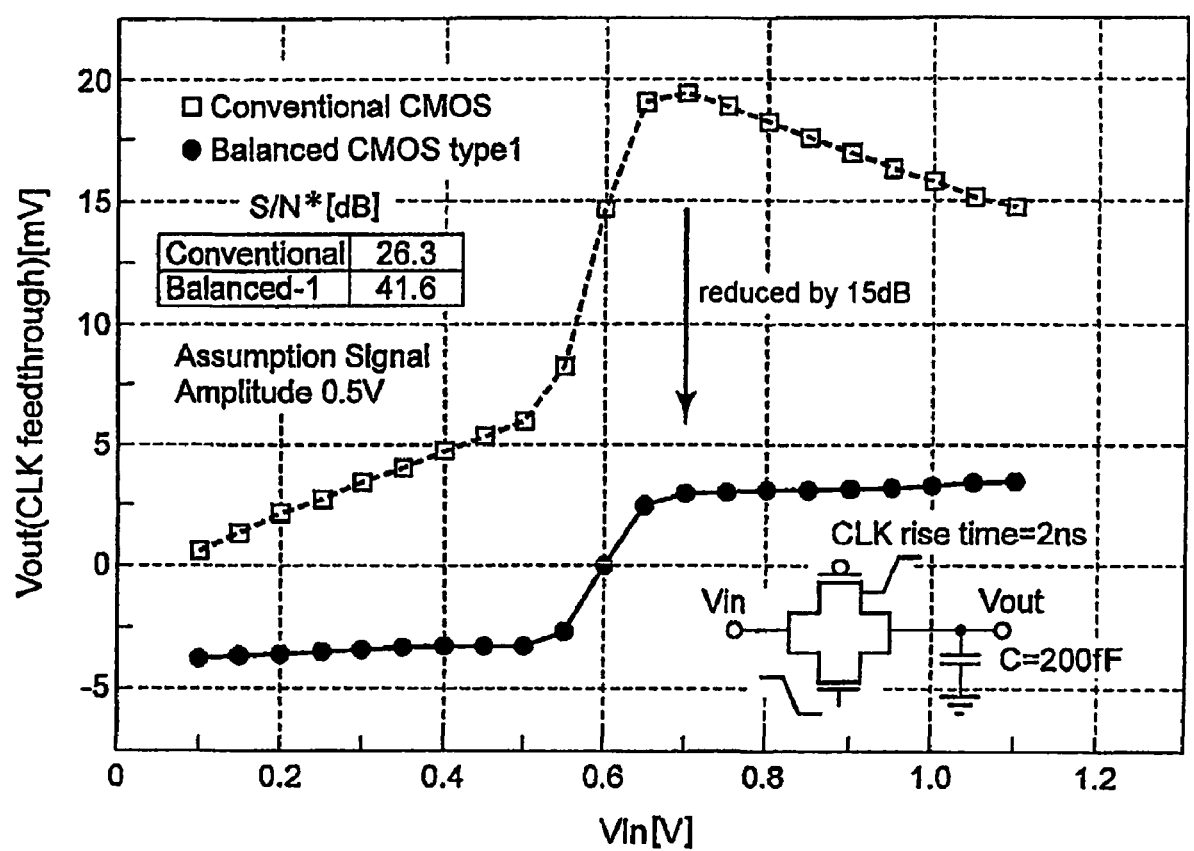
FIG. 3 is a diagram showing an effect of the first embodiment of this invention.
Figure 4:
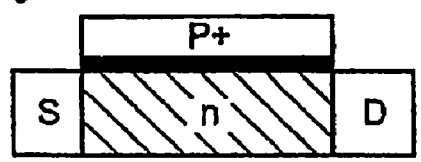
FIG. 4(*a*), (*b*), (*c*), and (*d*) are diagrams showing the operating principle of an accumulation-mode transistor used in this invention.
Figure 4:
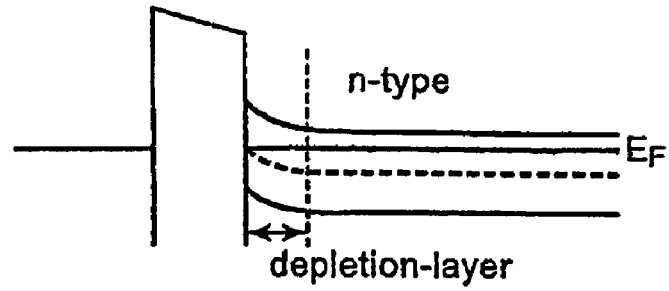
Figure 4:
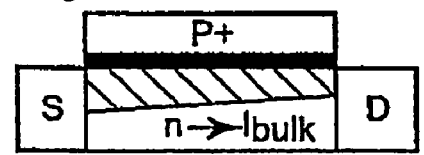
Figure 4:
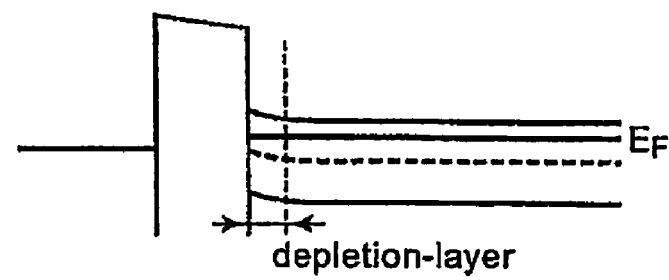
Figure 4:
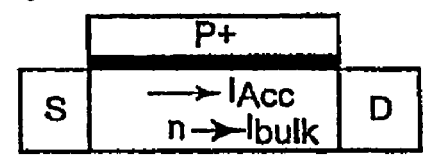
Figure 4:
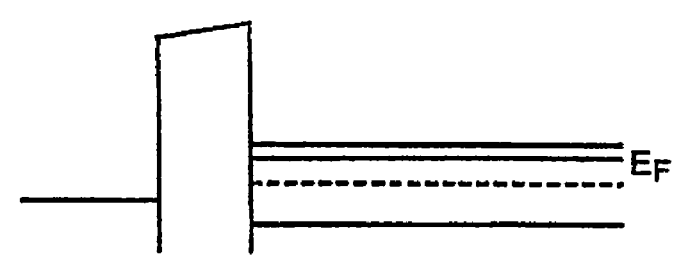
Figure 4:
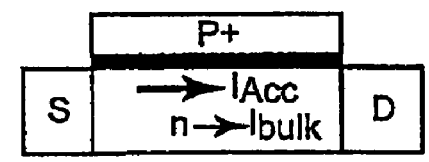
Figure 4:
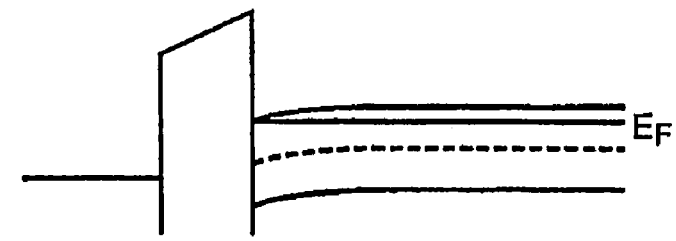
Figure 5:
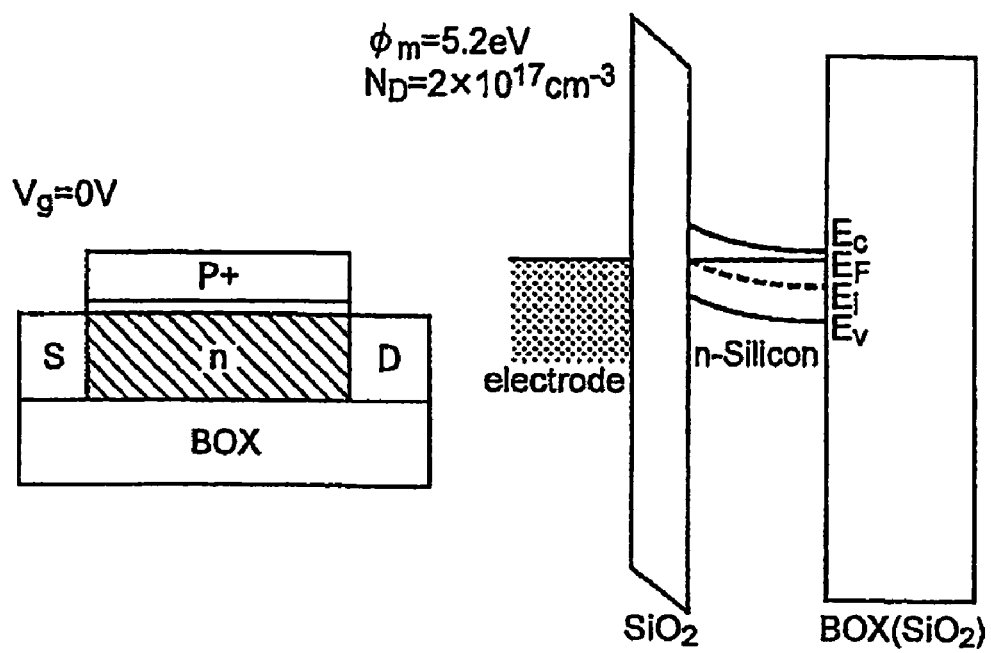
FIG. 5(*a*) and (*b*) are sectional views showing the structure of an accumulation-mode transistor according to this invention and diagrams showing the band structure thereof.
Figure 5:
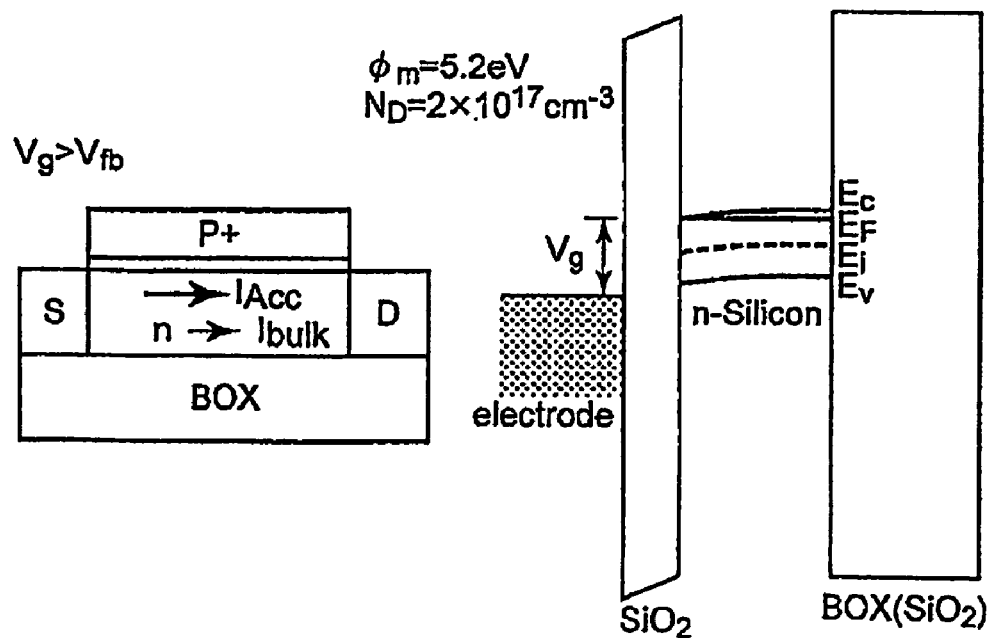
Figure 10:
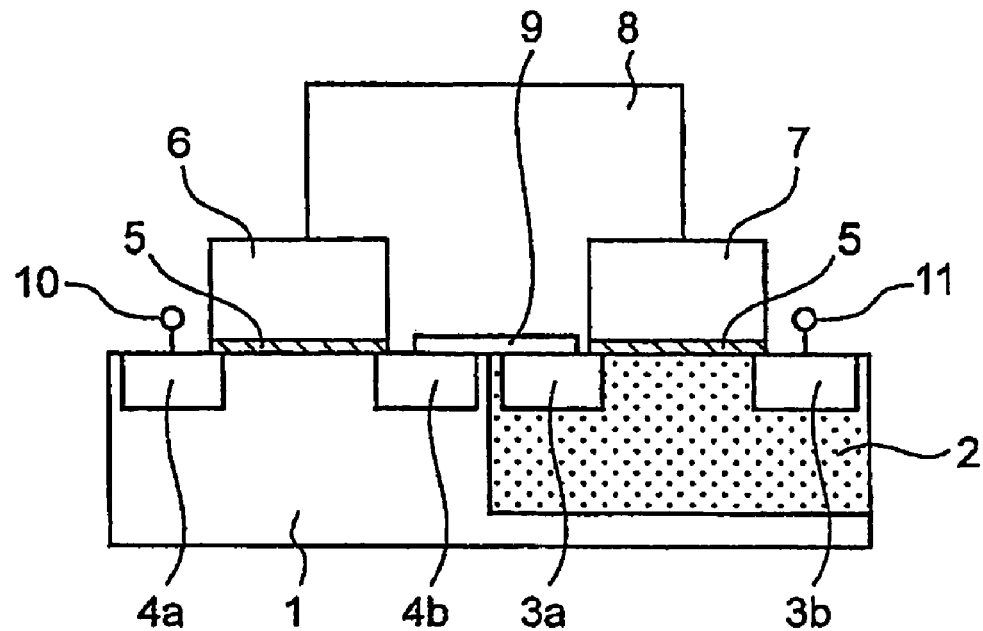
FIG. 10(*a*) and (*b*) are a sectional view and a plan view of a conventional semiconductor device, respectively.
Figure 10:
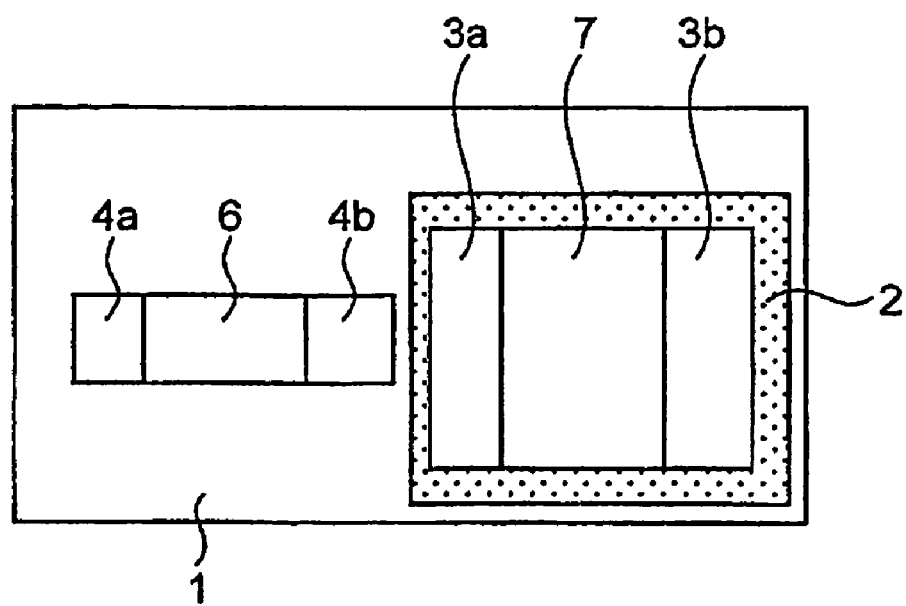

With this configuration, the channel areas and the gate areas of the NMOS transistor 100n and the PMOS transistor 100p can be made substantially equal to each other and, therefore, the current driving capabilities of both transistors and thus the operating speeds thereof can be made substantially equal to each other, so that a full-balanced CMOS can be obtained. With this configuration, it is possible to reduce the required area to half or less and to increase the operating speed by about one digit as compared with the conventional example of FIG. 10. Further, by equalizing the gate areas of both p- and n-transistors, the gate capacitances of both transistors become equal to each other, so that, as shown in FIG. 3, the offset noise of an analog switch formed by these transistors can be reduced by as much as 15 dB. Herein, in the embodiment shown in FIG. 1(c), as described before, the PMOS transistor and the NMOS transistor are each in the form of the inversion-mode transistor.

Figure 2:
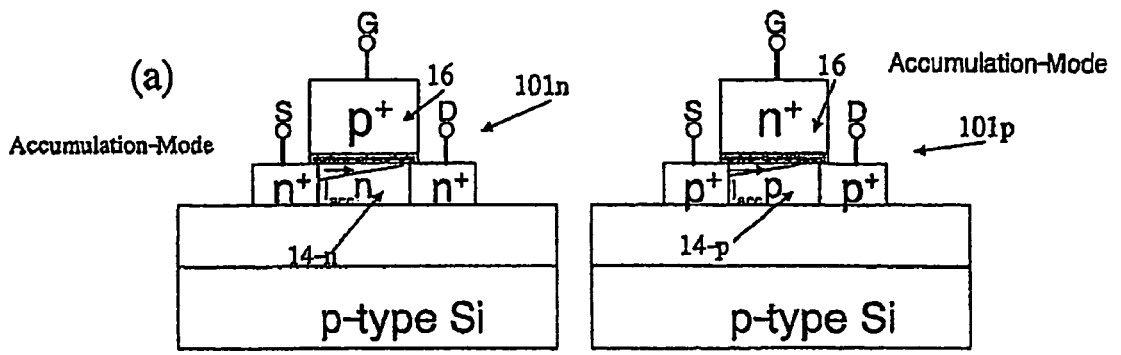
FIG. 2(*a*), (*b*), and (*c*) are sectional views of semiconductor devices according to other three embodiments of this invention.
Figure 2:
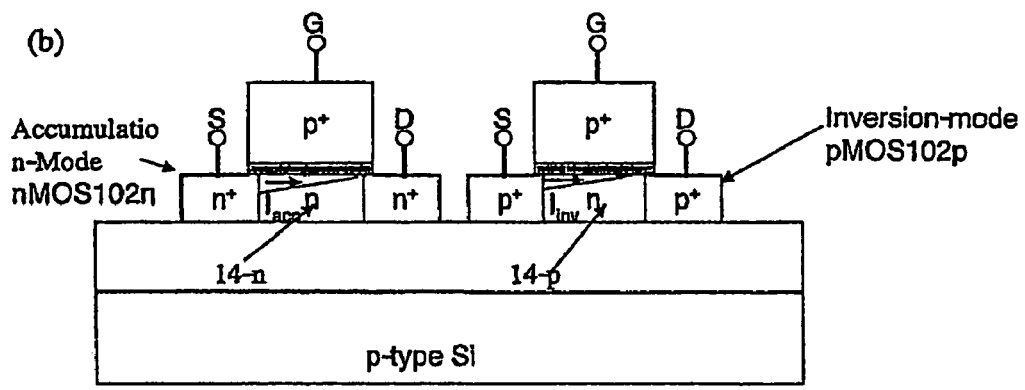
Figure 2:
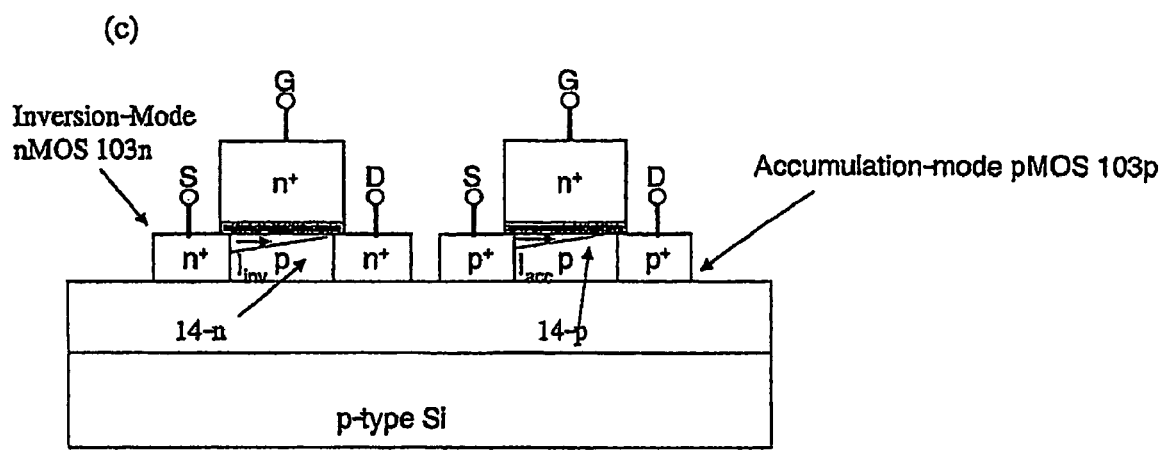

FIG. 2(a), (b), and (c) show three embodiments other than FIG. 1(c) and are sectional views in the direction corresponding to FIG. 1(c). FIG. 2(a) shows an example in which an n-channel transistor (i.e. an NMOS transistor) 101n and a p-channel transistor (i.e. a PMOS transistor) 101p are each formed by the accumulation mode transistors. FIG. 2(b) shows an example in which an n-channel transistor (i.e. an NMOS transistor) 102n is formed by the accumulation mode transistor and a p-channel transistor (PMOS transistor) 102p is formed by the inversion mode transistor. Since the structure of FIG. 2(b) has the n-channel transistor and the p-channel transistor both of which are formed by wells (n-wells) of the same conductivity type and gate electrodes of the same conductivity type ($p^+$-type), there is an advantage in that the process is simplified. Further, using the accumulation-mode n-channel transistor, the 1/f noise of the entire CMOS can be reduced.

Figure 9:
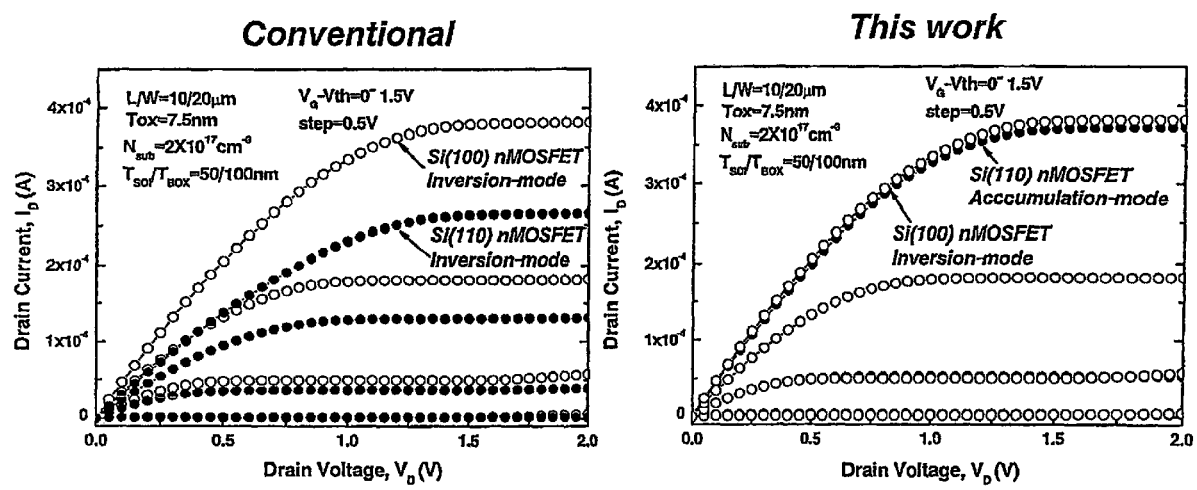
FIG. 9 is a diagram showing the drain voltage-drain current characteristics of an accumulation-mode transistor according to this invention.

On the other hand, FIG. 2(c) shows an example in which an n-channel transistor (NMOS transistor) 103n is of the inversion mode and a p-channel transistor (PMOS transistor) 103p is of the accumulation mode. Since the structure of this example has the n-channel transistor and the p-channel transistor both of which are formed by wells (p-wells) of the same conductivity type and gate electrodes of the same conductivity type ($n^+$-type), there is an advantage in that the process is simplified. Further, since only the $n^+$-type polysilicon gate electrodes are used, it is possible to prevent diffusion of boron caused by film thickness reduction (because boron tends to diffuse into a gate oxide film and thus a phenomenon is caused to occur such that the interface mobility of carriers is degraded). As will be described later, there is also an advantage in that, using the accumulation-mode transistor, the current driving capability increases as compared with the inversion-mode transistor (FIG. 9).

Herein, referring to FIGS. 4 to 9, the accumulation-mode transistor according to this invention will be described using the n-channel transistors (NMOS transistors) 101n and 102n of FIGS. 2(a) and (b) as examples.

FIG. 4(a) to (d) show the operating principle of the accumulation-mode n-channel transistor (NMOS transistor). At first, as shown in FIG. 4(a), when a gate voltage Vg is zero, a depletion layer extends over the entire SOI layer. As shown in FIG. 4(b), when the gate voltage Vg is applied, the depletion layer retreats to the upper surface of the channel and a bulk current Ibulk flows. Subsequently, when the gate voltage increases, an accumulated current Iacc also flows as shown in FIGS. 4(c) and (d).

This phenomenon will be explained using FIGS. 5(a) and (b). By employing the SOI structure and setting the width of a depletion layer formed by a work function difference between the gate electrode and the SOI layer to be greater than the thickness of the SOI layer, it is possible to obtain an accumulation-structure normally-off type MOS transistor as shown in FIG. 5(a). Herein, a work function difference with respect to the SOI layer can be realized by using $p^+$-polysilicon (work function 5.2 eV) as the gate electrode in the n-channel transistor and by using $n^+$-polysilicon (work function 4.1 eV) as the gate electrode in the p-channel transistor.

As shown in FIG. 9, by forming an accumulation-structure n-channel transistor on the silicon (110) plane, it is possible to realize the current driving capability equal to that of a normal n-channel transistor formed on the silicon (100) plane. Further, by forming an accumulation-structure p-channel transistor on the silicon (110) plane, it is possible to realize the current driving capability that is 2.5 times that of a p-channel transistor formed on the silicon (100) plane.

Figure 6:
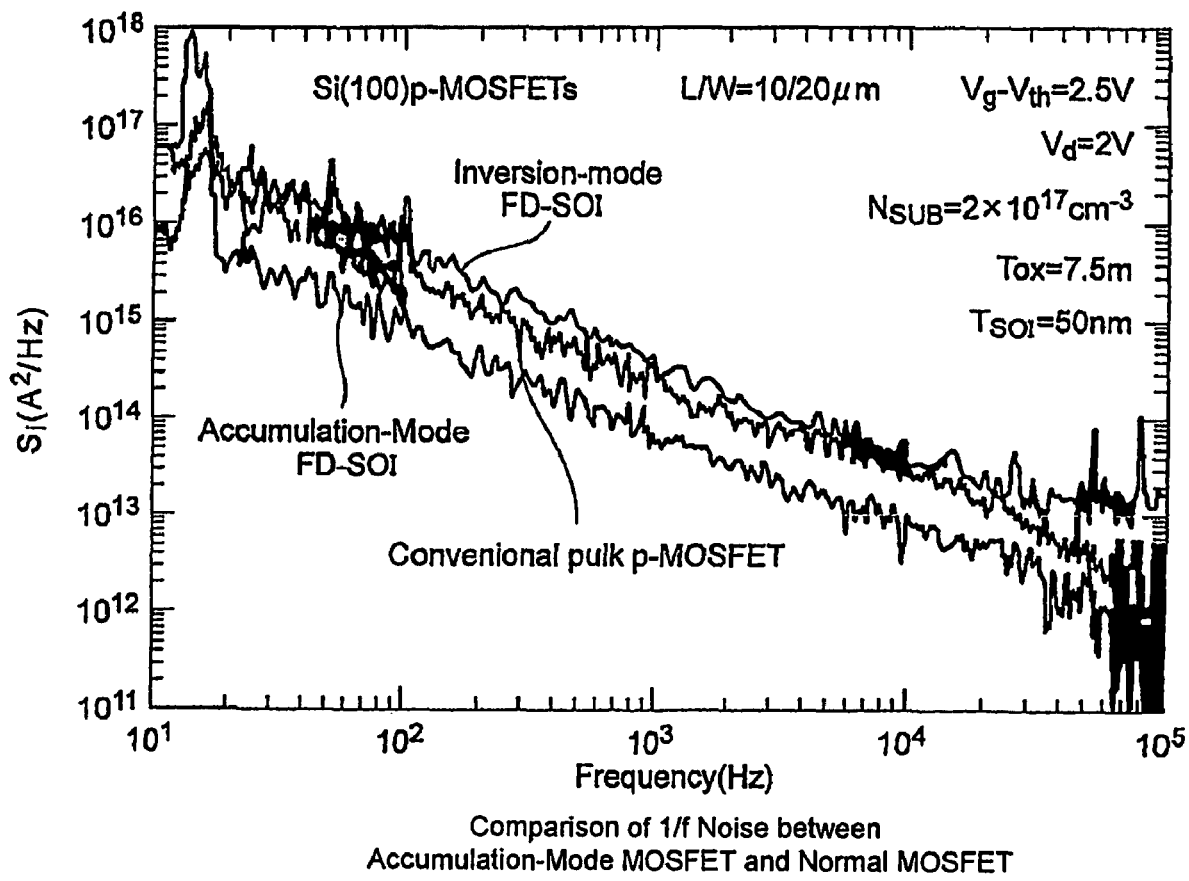
FIG. 6 is a diagram showing 1/f noise of an accumulation-mode transistor according to this invention.
Figure 7:
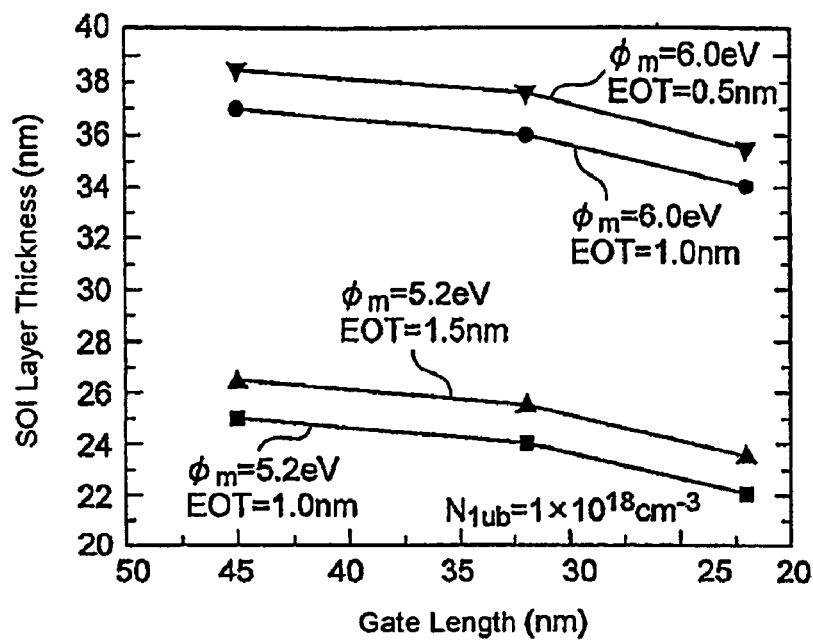
FIG. 7(*a*) and (*b*) are diagrams showing the relationship between the work function of a gate electrode and the thickness of an SOI layer in an accumulation-mode transistor according to this invention.
Figure 7:
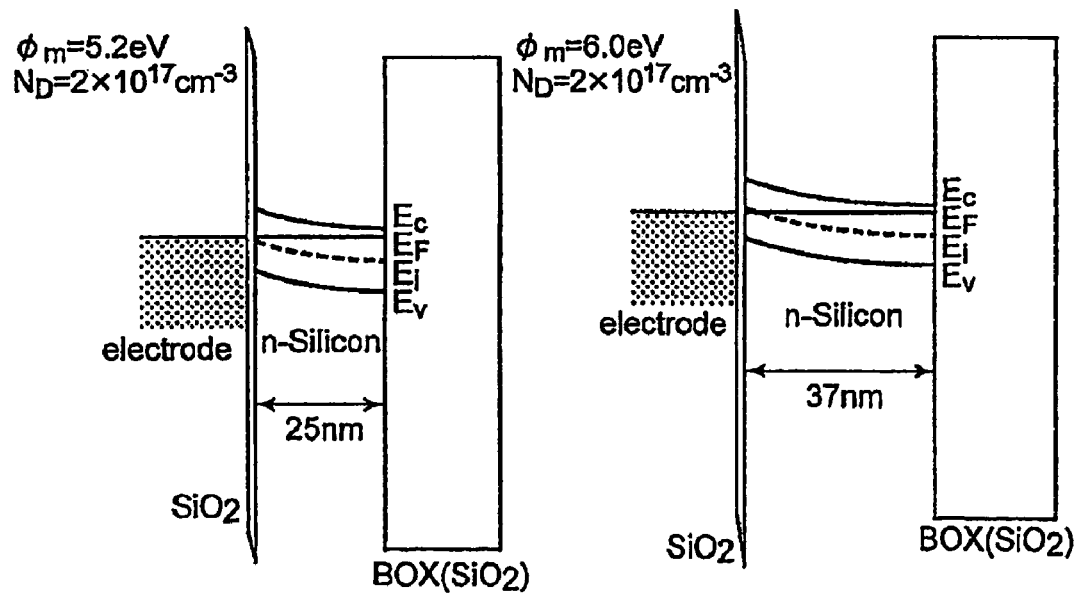

Further, as shown in FIG. 6, the 1/f noise can also be reduced. The accumulation-mode device of this invention does not realize normally-off by a pn junction barrier, but establishes normally off by optimizing the work function difference between the gate electrode and the SOI layer, the thickness of the SOI layer, the drain voltage, and the source-drain distance so that a depletion layer is formed as a barrier between the source and the drain when the gate voltage is 0V as shown in the gate FIG. 5(a). As shown in FIG. 5(b), since a channel is formed in an accumulation layer when the device is on, a vertical electric field of the channel region becomes, smaller as compared with an inversion-mode MOS transistor that forms a normal inversion layer and, thus, it is possible to increase the effective mobility. Therefore, even if the impurity concentration in the SOI layer increases, degradation of the mobility does not occur. Further, since the current flows not only in the accumulation layer but also in the entire SOI layer (bulk portion) when the device is on, it is possible to increase the current driving capability as the impurity concentration in the SOI layer becomes higher.

As compared with a normal MOS transistor in which an advance of miniaturization brings about degradation of the channel mobility with an increase of the impurity concentration in a channel region, the accumulation-mode device of this invention is very advantageous for the miniaturization. In order to increase the current driving capability as much as possible and realize normally-off while providing punch-through resistance to the miniaturization, it is preferable to use a gate electrode with a work function as large as possible in an accumulation-mode n-channel transistor and a gate electrode with a work function as small as possible in an accumulation-mode p-channel transistor.

In the accumulation-mode device of this invention, a depletion layer is formed in the SOI layer by increasing a work function difference between the gate electrode material and the SOI layer as described above so that an electric field in the channel direction caused by a voltage applied to the drain electrode does not affect an end of the source, thereby achieving the punch-through resistance. The current driving capability increases as the thickness of the SOI layer becomes greater, but an electric field from the gate generated by the work function difference hardly exerts an influence to the lower end (bottom surface) of the SOI layer. Therefore, the most important factor in the accumulation-mode device of this invention is to increase the work function difference.

FIG. 7(a) shows the thickness of an SOI layer that is allowed (normally-off is achieved) when use is made of a gate electrode with a work function of 5.2 eV or 6.0 eV in each accumulation-mode n-channel transistor. There are shown cases with gate insulating films of 0.5 nm and 1.0 nm by EOT, respectively. The thickness of the SOI layer allowed for achieving normally-off in each miniaturization generation (gate length) increases as the work function becomes larger and, in the 22 nm generation, the thickness becomes about twice in the case of 6.0 eV as compared with that in the case of 5.2 eV. FIG. 7(b) shows band diagrams when the 5.2 eV and 6.0 eV gate electrodes are used (insulating film thickness 1 nm). As shown in the diagrams, as the work function increases, the SOI layer can be thicker and the current driving capability increases.

Figure 8:
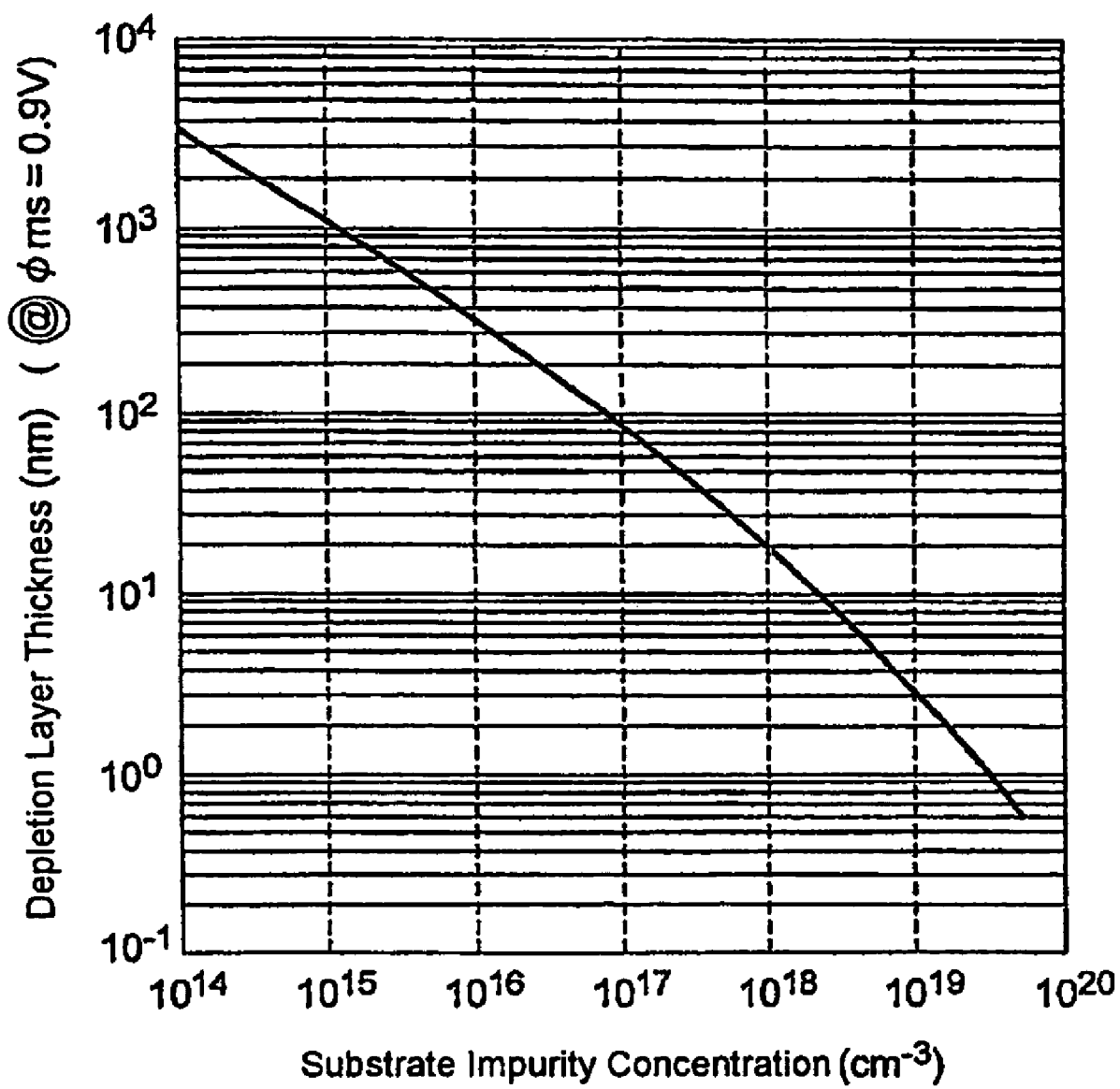
FIG. 8 is a diagram for use in illustrating the relationship between the depletion layer thickness and the substrate impurity concentration in an accumulation-mode transistor according to the embodiment of this invention.

FIG. 8 shows a correlation diagram of the depletion layer thickness and the substrate impurity concentration. Referring to this figure, in the accumulation-mode n-channel transistor 102n, 103n of this invention, when the gate electrode 16 is formed of $P^+$-polycrystalline silicon, since its work function is approximately 5.15 eV and a work function of the $10^{17} cm^{-3}$ n-type silicon layer 14n of the substrate is approximately 4.25 eV, a work function difference of approximately 0.9 eV occurs. In this event, since the thickness of a depletion layer is about 90 nm, the SOI layer is fully depleted even if it has a thickness of 45 nm. FIG. 8 shows the relationship between the substrate impurity concentration and the depletion layer thickness when the work function difference is 0.9V. Herein, the substrate impurity concentration and the SOI film thickness can be selected in a range where the SOI film thickness is smaller than the depletion layer thickness. As a gate electrode material, use may be made, instead of the polycrystalline silicon, of W, Pt, Ni, Ge, Ru, or its silicide if the SOI layer is fully depleted in consideration of a work function difference.

Figure 11:
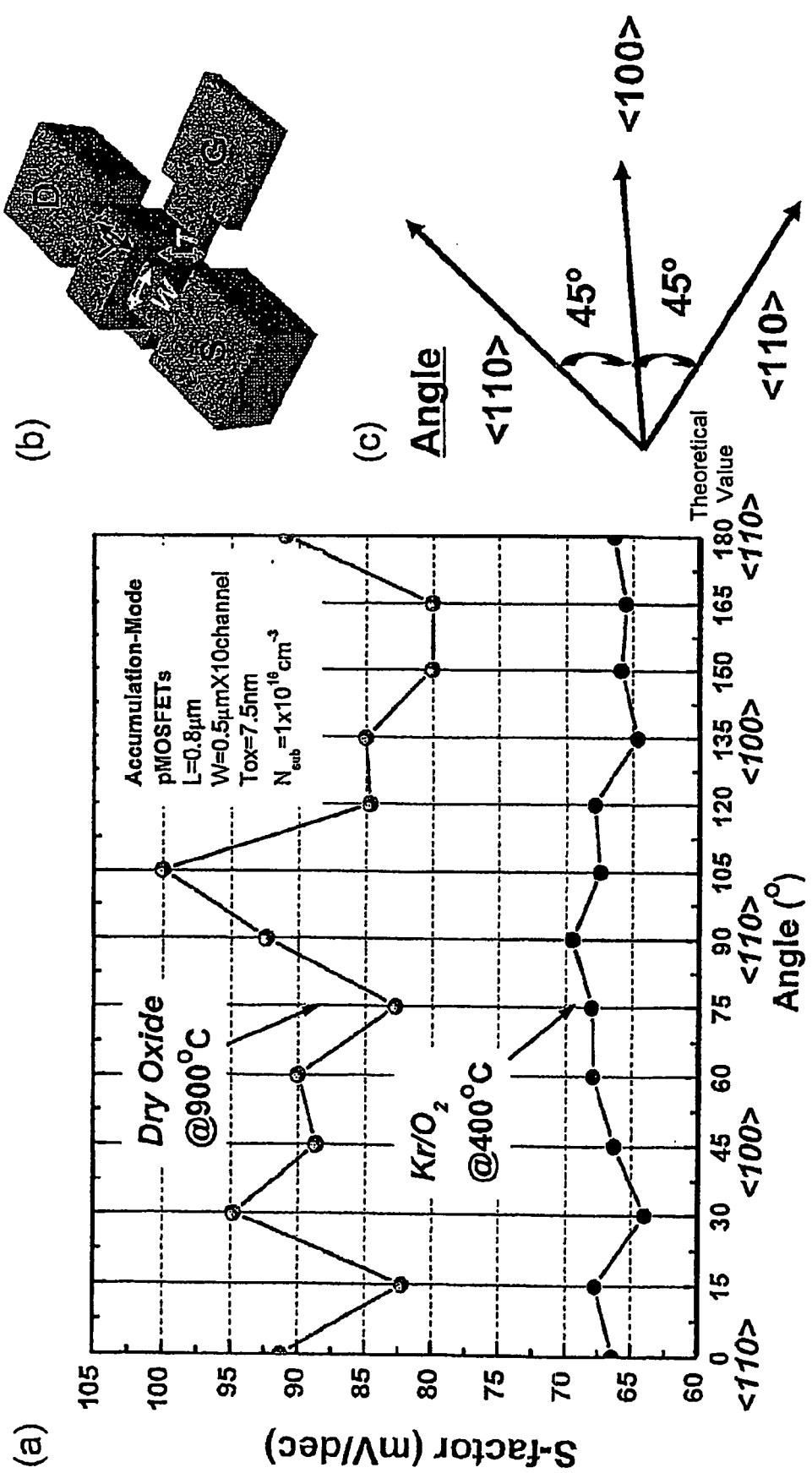
FIG. 11(*a*), (*b*), and (*c*) are diagrams for explaining, by comparison, the relationships between the channel orientation and the S-factor in the case where a gate insulating film is formed by thermal oxidation and in the case where a gate insulating film is formed by radical oxidation.

It is preferable that the gate insulating film of the semiconductor device of this invention be formed by radical oxidation, radical nitriding, or radical oxynitriding using a microwave-excited high-density plasma, which will be explained using FIG. 11. FIG. 11(*a*) is a graph showing S-factors according to channel orientations in the case where a gate insulating film is formed by thermal oxidation and in the case where a gate insulating film is formed by radical oxidation.

Measurement was carried out using, as devices, 10 accumulation-mode three-dimensional p-channel MOS transistors as shown in FIG. 11(*b*). The surface of a channel region is the (100) plane and its orientation is a <110> direction. Data of the channel region are as described in FIG. 11(*a*). When the crystal plane of the surface of the channel region is the (100) plane and its crystal orientation is the <110> direction, since the same crystal plane appears on the side surfaces of the channel region, the crystal plane of the side surfaces of the channel region in this case is the (110) plane.

As shown in FIG. 11(*c*), when the orientation of the channel surface is rotated by 45° from a <110> direction, it becomes a <100> direction. FIG. 11(*a*) shows an S-factor at every 15° when the orientation was rotated by 180° in this manner. The S-factor represents a gate voltage required for increasing the drain current 10 times and thus is better as it is smaller, wherein the theoretical value is 60 mV/dec. As shown in FIG. 11(*a*), it is seen that when a gate insulating film is formed by thermal oxidation (900° C. dry atmosphere), the S-factor is 80 to 100 mV/dec which is 1.3 to 1.7 times the theoretical value and, further, variation is large depending on the crystal plane orientation, while, in the case of radical oxidation (oxidation at 400° C. with a plasma of Kr and oxygen), the S-factor is 64 to 69 mV/dec which is only 1.06 to 1.15 times the theoretical value, thus extremely excellent as compared with the conventional thermal oxide film. It has been confirmed that this also applies to the case where a gate insulating film is formed by radical nitriding or radical oxynitriding.

In the CMOS structure of this invention, the SOI layer preferably has a plane orientation inclined within ±10° from the (110) plane and the thickness of the SOI layer is set smaller than that of a depletion layer caused by a work function difference between the gate electrode and the SOI layer in the accumulation-mode transistor. With this configuration, the current driving capability is improved so that the NMOS transistor and the PMOS transistor are balanced to have substantially the same current driving capability. Further, by forming the NMOS transistor and the PMOS transistor on the same semiconductor substrate, there is also an advantage in that the area corresponding to insulation isolation can be reduced. By balancing the NMOS transistor and the PMOS transistor so as to have substantially the same current driving capability in this manner, there is obtained a semiconductor device that can increase the integration degree.

INDUSTRIAL APPLICABILITY

While this invention has been concretely described based on the embodiments, it is needless to say that this invention is not limited thereto, but can be variously changed within a range not departing from the gist of the invention. For example, this invention is not only applicable as an inverter circuit to a logic circuit, but also applicable to other electronic circuits.

The invention claimed is:

1. A semiconductor device comprising a pair of an n-channel transistor and a p-channel transistor, said n-channel transistor being formed using a first semiconductor layer provided on an SOI substrate and a first gate insulating layer covering at least part of a surface of said first semiconductor layer, said p-channel transistor being formed using a second semiconductor layer provided on said SOI substrate and a second gate insulating layer covering at least part of a surface of said second semiconductor layer;

wherein said first semiconductor layer has a first region and a second region for forming a channel of said n-channel transistor and said second semiconductor layer has a third region for forming a channel of said p-channel transistor, a surface of said first region having a (110) plane or a plane within ±10° from the (110) plane, and a surface of said second region having one or a plurality of planes different from the plane within ±10° from the (110) plane and adapted to provide a greater mobility of electrons than the plane within ±10° from the (110) plane, with a surface of said third region having a (110) plane or a plane within ±10° from the (110) plane; and wherein a width and a length of the surface of said first region, a height and a length of the surface of said second region, and a width and a length of the surface of said third region are determined so that the sum of an area of the surface of said first region and an area of the surface of said second region is substantially equal or equivalent to an area of the surface of said third region and, further, operating speeds of said n-channel transistor and said p-channel transistor are substantially equal or equivalent to each other.

2. A semiconductor device according to claim 1, wherein said n-channel transistor and said p-channel transistor are each normally off; and wherein said n-channel transistor is either an inversion mode transistor or an accumulation mode transistor, while said p-channel transistor is either the inversion mode transistor or the accumulation mode transistor.

3. A semiconductor device according to claim 2, wherein: said n-channel transistor and said p-channel transistor are the inversion mode transistors.

4. A semiconductor device according to claim 2, wherein: said n-channel transistor and said p-channel transistor are the accumulation mode transistors.

5. A semiconductor device according to claim 2, wherein: said n-channel transistor is an inversion mode transistor and said p-channel transistor is an accumulation mode transistor.

6. A semiconductor device according to claim 2, wherein: said n-channel transistor is an accumulation mode transistor and said p-channel transistor is an inversion mode transistor.

7. A semiconductor device according to claim 2, wherein:
a material of a second gate electrode provided on said second gate insulating film and an impurity concentration in said second semiconductor layer are selected so that a thickness of a depletion layer formed in said second semiconductor layer by a work function difference between said second gate electrode and said second semiconductor layer becomes greater than the thickness of said second semiconductor layer.

8. A semiconductor device according to claim 2, wherein:
a material of a first gate electrode provided on said first gate insulating film and an impurity concentration in said first semiconductor layer are selected so that a thickness of a depletion layer formed in said first semiconductor layer by a work function difference between said first gate electrode and said first semiconductor layer becomes greater than the thickness of said first semiconductor layer.

9. A semiconductor device according to claim 1, wherein:
said first and second gate insulating films each contain at least one kind of $SiO_2$, $Si_3N_4$, an oxide of a metal silicon alloy, and a nitride of a metal silicon alloy.

10. A semiconductor device according to claim 9, wherein:
said first and second gate insulating films are formed by a microwave-excited plasma at a temperature of 600° C. or less.

11. A semiconductor device according to claim 1, wherein:
the length of the surface of said first region, the length of the surface of said second region, and the length of the surface of said third region are determined so as to be substantially equal to each other.

12. A semiconductor device comprising at least a pair of a first transistor of one conductivity type and a second transistor of another conductivity type, said first transistor being formed using a first semiconductor layer provided on an SOI substrate and a first gate insulating layer covering at least part of a surface of said first semiconductor layer, said second transistor being formed using a second semiconductor layer provided on said SOI substrate and a second gate insulating layer covering at least part of a surface of said second semiconductor layer;
wherein a surface of a first region of said first semiconductor layer and forming a channel of said first transistor has a first crystal plane, and a surface of a second region of said first semiconductor layer forming a channel region of said first transistor and provided on a plane crossing the surface of said first region has a second crystal plane different from said first crystal plane and adapted to provide a different mobility of carriers than said first crystal plane, while a surface of a third region of said second semiconductor layer and forming a channel of said second transistor has said first crystal plane; and
wherein, given that a mutual conductance gm on the surface of said first region is gm1, a mutual conductance gm on the surface of said second region is gm2 that is greater than gm1 (i.e. gm2>gm1), a mutual conductance gm on the surface of said third region is gm3 that is greater than gm1 but smaller than gm2 (i.e. gm1<gm3<gm2), a length and a width of the surface of said first region are L1 and W1, respectively, a length and a width of the surface of said second region are L1 and W2, respectively, a length and a width of the surface of said third region are L2 and W3, respectively, and any three of W1, W2, W3, L1, and L2 are set to predetermined values,
said first transistor and said second transistor have areas of channel regions thereof that are substantially equal or equivalent to each other and operating speeds thereof that are substantially equal or equivalent to each other, with the remaining two of W1, W2, W3, L1, and L2 being determined so as to substantially satisfy:

$$W1 \times L1 + W2 \times L1 = W3 \times L2$$

and, further, substantially satisfy $$(gm1 \times W1/L1) + (gm2 \times W2/L1) = gm3 \cdot W3/L2.$$

13. A semiconductor device according to claim 12, wherein:
said L1 and said L2 are set to be equal to each other and any one of W1, W2, and W3 is set to a predetermined value, and
wherein the remaining two of W1, W2, and W3 are determined so as to substantially satisfy $$W1 + W2 = W3 \times L2$$

and, further, substantially satisfy $$gm1 \times W1 + gm2 \times W2 = gm3 \times W3.$$

14. A semiconductor device according to claim 12, wherein:
said surface of said second region is formed by two side surfaces of said first semiconductor layer extending substantially perpendicularly on both sides of the surface of said first region.

15. A semiconductor device according to claim 14, wherein:
said first crystal plane in said first transistor and said second transistor is specified by a (110) plane or a plane within ±10° from the (110) plane.

16. A semiconductor device according to claim 15, wherein:
said first transistor and said second transistor are an n-channel transistor and a p-channel transistor, respectively.

17. A semiconductor device according to claim 12, wherein said first transistor and said second transistor are each normally off; and
wherein said first transistor is either an inversion mode transistor or an accumulation mode transistor, while said second transistor is either the inversion mode transistor or the accumulation mode transistor.

18. A semiconductor device according to claim 12, wherein:
a material of a second gate electrode provided on said second gate insulating film and an impurity concentration in said second semiconductor layer are selected so that a thickness of a depletion layer formed in said second semiconductor layer by a work function difference between said second gate electrode and said second semiconductor layer becomes greater than the thickness of said second semiconductor layer.

19. A semiconductor device according to claim 12, wherein:
a material of a first gate electrode provided on said first gate insulating film and an impurity concentration in said first semiconductor layer are selected so that a thickness of a depletion layer formed in said first semiconductor layer by a work function difference between said first gate electrode and said first semiconductor layer becomes greater than the thickness of said first semiconductor layer.

20. A semiconductor device according to claim 12, wherein:
said first and second gate insulating films each contain at least one kind of $SiO_2$, $Si_3N_4$, an oxide of a metal silicon alloy oxide, and a nitride of a metal silicon alloy.

21. A semiconductor device comprising a pair of an n-channel transistor and a p-channel transistor, said n-channel transistor having a three-dimensional structure and being formed using a first semiconductor layer provided on an SOI substrate and a first gate insulating layer covering at least part of a surface of said first semiconductor layer, said p-channel transistor having a planar structure and being formed using a second semiconductor layer provided on said SOI substrate and a second gate insulating layer covering at least part of a surface of said second semiconductor layer;
wherein said first semiconductor layer has a first region and a second region for forming a channel of said n-channel transistor and said second semiconductor layer has a third region for forming a channel of said p-channel transistor, a surface of said first region having a (110) plane or a plane within ±10° from the (110) plane, and a surface of said second region having one or a plurality of planes different from the plane within ±10° from the (110) plane and adapted to provide a greater mobility of electrons than the plane within ±10° from the (110) plane, with a surface of a said third region having a (110) plane or a plane within ±10° from the (110) plane; and
wherein a width and a length of the surface of said first region, a height and a length of the surface of said second region, and a width and a length of the surface of said third region are determined so that the sum of an area of the surface of said first region and an area of the surface of said second region is substantially equal or equivalent to an area of the surface of said third region and, further, operating speeds of said n-channel transistor and said p-channel transistor are substantially equal or equivalent to each other.

22. A semiconductor device comprising at least a pair of a first transistor of one conductivity type and a second transistor of another conductivity type, said first transistor having a three-dimensional structure and being formed using a first semiconductor layer provided on an SOI substrate and a first gate insulating layer covering at least part of a surface of said first semiconductor layer, said second transistor having a planar structure and being formed using a second semiconductor layer provided on said SOI substrate and a second gate insulating layer covering at least part of a surface of said second semiconductor layer;
wherein a surface of a first region of said first semiconductor layer and forming a channel of said first transistor has a first crystal plane, and a surface of a second region of said first semiconductor layer forming a channel region of said first transistor and provided on a plane crossing the surface of said first region has a second crystal plane different from said first crystal plane and adapted to provide a different mobility of carriers than said first crystal plane, while a surface of a third region of said second semiconductor layer and forming a channel of said second transistor has said first crystal plane; and
wherein, given that a mutual conductance gm on the surface of said first region is gm1, a mutual conductance gm on the surface of said second region is gm2 that is greater than gm1 (i.e. gm2>gm1), a mutual conductance gm on the surface of said third region is gm3 that is greater than gm1 but smaller than gm2 (i.e. gm1<gm3<gm2), a length and a width of the surface of said first region are L1 and W1, respectively, a length and a width of the surface of said second region are L1 and W2, respectively, a length and a width of the surface of said third region are L2 and W3, respectively, and any three of W1, W2, W3, L1, and L2 are set to predetermined values,
said first transistor and said second transistor have areas of channel regions thereof that are substantially equal or equivalent to each other and operating speeds thereof that are substantially equal or equivalent to each other, with the remaining two of W1, W2, W3, L1, and L2 being determined so as to substantially satisfy:

$$W1 \times L1 + W2 \times L1 = W3 \times L2$$

and, further, substantially satisfy $$(gm1 \times W1/L1) + (gm2 \times W2/L1) = gm3 \times W3/L2.$$

* * * * *